(12) United States Patent
Zhang et al.

(10) Patent No.: US 11,069,868 B2
(45) Date of Patent: Jul. 20, 2021

(54) SEMICONDUCTOR STRUCTURE, SEMICONDUCTOR DEVICE, PHOTODETECTOR AND SPECTROMETER

(71) Applicants: Tsinghua University, Beijing (CN); HON HAI PRECISION INDUSTRY CO., LTD., New Taipei (TW)

(72) Inventors: Ke Zhang, Beijing (CN); Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 97 days.

(21) Appl. No.: 16/448,086

(22) Filed: Jun. 21, 2019

(65) Prior Publication Data

US 2020/0013972 A1    Jan. 9, 2020

(30) Foreign Application Priority Data

Jul. 3, 2018    (CN) .......................... 201810713762.4

(51) Int. Cl.
*H01L 51/42*    (2006.01)
*H01L 51/00*    (2006.01)
(Continued)

(52) U.S. Cl.
CPC ...... *H01L 51/4213* (2013.01); *H01L 51/0048* (2013.01); *H01L 51/057* (2013.01);
(Continued)

(58) Field of Classification Search
CPC ............. H01L 51/4213; H01L 51/0048; H01L 51/057; H01L 51/4286; H01L 29/267; H01L 31/0336; B82Y 10/00; B82Y 15/00
See application file for complete search history.

(56) References Cited

U.S. PATENT DOCUMENTS 7,872,334 B2 *   1/2011   Chen ................... H01L 51/0583
                                                            257/653
8,018,563 B2 *   9/2011   Jones .................. H01L 31/1884
                                                            349/139
(Continued)

FOREIGN PATENT DOCUMENTS

TW    201802907    1/2018
TW    201822358    6/2018

*Primary Examiner* — Dale E Page
*Assistant Examiner* — Quovaunda Jefferson
(74) *Attorney, Agent, or Firm* — ScienBiziP, P.C.

(57) ABSTRACT

The present invention relates to a semiconductor structure. The semiconductor structure comprises a semiconductor layer, at least one metallic carbon nanotube, and at least one graphene layer. The semiconductor layer defines a first surface and a second surface opposite to the first surface. The at least one metallic carbon nanotube is located on the first surface of the semiconductor layer. The at least one graphene layer is located on the second surface of the semiconductor layer. The at least one metallic carbon nanotube, the semiconductor layer and the at least one graphene layer are stacked with each other to form at least one three-layered stereoscopic structure. The present invention also relates to a semiconductor device, and a photodetector.

16 Claims, 11 Drawing Sheets

(51) Int. Cl.
  *H01L 51/05* (2006.01)
  *B82Y 10/00* (2011.01)
  *H01L 29/267* (2006.01)
  *H01L 31/0336* (2006.01)
  *B82Y 15/00* (2011.01)

(52) U.S. Cl.
  CPC .......... *H01L 51/4286* (2013.01); *B82Y 10/00* (2013.01); *B82Y 15/00* (2013.01); *H01L 29/267* (2013.01); *H01L 31/0336* (2013.01)

(56) References Cited

U.S. PATENT DOCUMENTS

| | | | |
|---|---|---|---|
| 8,890,116 B2* | 11/2014 | Chen .................. | H01L 51/0048 257/20 |
| 10,244,400 B2* | 3/2019 | Huang .............. | H04W 36/0072 |
| 10,600,925 B2* | 3/2020 | Zhang ............. | H01L 31/022408 |
| 10,748,992 B2* | 8/2020 | Zhang ............... | H01L 21/02425 |
| 2013/0082234 A1* | 4/2013 | Bao ....................... | H01L 51/444 257/9 |
| 2015/0075602 A1* | 3/2015 | Ozyilmaz ....... | H01L 31/022425 136/256 |
| 2018/0006231 A1 | 1/2018 | Zhang et al. | |
| 2018/0158960 A1 | 6/2018 | Huo et al. | |

* cited by examiner

SEMICONDUCTOR STRUCTURE, SEMICONDUCTOR DEVICE, PHOTODETECTOR AND SPECTROMETER

CROSS-REFERENCE TO RELATED APPLICATIONS

This application claims all benefits accruing under 35 U.S.C. § 119 from China Patent Application No. 201810713762.4, filed on Jul. 3, 2018, in the China National Intellectual Property Administration, the contents of which are hereby incorporated by reference.

FIELD

The present disclosure relates to a semiconductor structure, a semiconductor device, a photodetector and a spectrometer.

BACKGROUND

A heterojunction is an interface region formed by a contact of two different semiconductor materials. According to conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions. The heterostructure can be used in semiconductor structure and semiconductor device.

In recent years, a research of Van der Waals heterostructures are constantly emerging. The Van der Waals heterojunction can be formed by stacking two-dimensional materials with different properties (electrical and optical, etc.). Therefore, properties of the combined "new" materials can be artificially regulated. Lattices of adjacent two-dimensional material layers do not have to match, because Van der Waals forces between the adjacent two-dimensional material layers are weak. In addition, the heterojunction has an atomic-level steep carrier (potential field) gradient without transitional layers. A two-class band relationship can usually formed between non-graphene two-dimensional layered materials such as a transition metal dichalcogenide, therefore the heterojunctions based on them can do a good work in carrier separation. In addition, with ultra thin thickness and special two-dimensional structure, the non-graphene two-dimensional layered materials provide strong gate response and are easily compatible with flexible substrates.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views.

DETAILED DESCRIPTION

Figure 1:
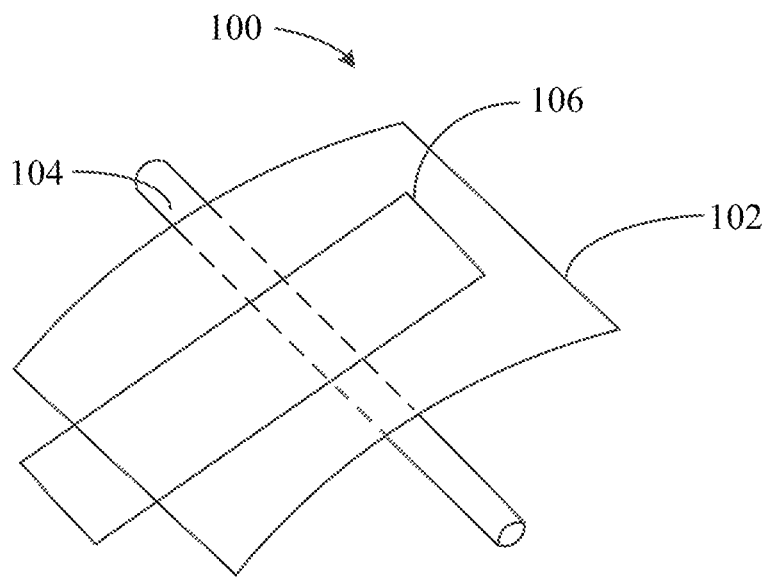
FIG. 1 shows a schematic view of overall structure of a semiconductor structure according to one embodiment.

The disclosure is illustrated by way of embodiments and not by way of limitation in the FIGures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figure to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "include," when utilized, means "include, but not necessarily limited to"; it specifically indicates open-ended inclusion or membership in the so-described combination, group, series, and the like.

A semiconductor structure is provided in the present disclosure. The semiconductor structure comprises a semiconductor layer, at least one metallic carbon nanotube and at least one graphene layer. The semiconductor layer defines a first surface and a second surface opposite to the first surface. The at least one metallic carbon nanotube is located on the first surface of the semiconductor layer. The at least one graphene layer is located on the second surface of the semiconductor layer. The semiconductor layer is located between the at least one metallic carbon nanotube and the at least one graphene layer. The at least one metallic carbon nanotube are crossed with the at least one graphene layer to form at least one overlapping area of the metallic carbon nanotube, the semiconductor layer, and the graphene layer. In each overlapping area, the metallic carbon nanotube, the semiconductor layer, and the graphene layer are stacked with each other to form a three-layered stereoscopic structure.

The semiconductor layer is a two-dimensional structure. The two-dimensional structure means that the semiconductor layer is thin. A thickness of the semiconductor layer can range from approximately 1 nanometer to approximately 200 nanometers. In one embodiment, the thickness of the semiconductor layer ranges from approximately 1 nanometer to approximately 100 nanometers. A material of the semiconductor layer is not limited. The semiconductor layer can be made from inorganic compound semiconductors, elemental semiconductors or organic semiconductors. The semiconductor layer can be P-type or N-type, such as gallium arsenide, silicon carbide, polysilicon, monocrystalline silicon, naphthalene or molybdenum sulfide. In one embodiment, the material of the semiconductor layer is transition metal sulfide. In another embodiment, the material of the semiconductor layer is molybdenum sulfide ($MoS_2$).

A diameter of the metallic carbon nanotube is not limited. The diameter of the metallic carbon nanotube can range from approximately 0.5 nanometers to 150 nanometers. The metallic carbon nanotube can be a single-walled metallic carbon nanotube or a multi-walled metallic carbon nanotube. In one embodiment, the at least one metallic carbon nanotube is a single metallic carbon nanotube. In another embodiment, the at least one metallic carbon nanotube comprises a plurality of metallic carbon nanotubes. The plurality of metallic carbon nanotubes are spaced apart from each other on the first surface of the semiconductor layer. A distance between the plurality of metallic carbon nanotubes is not limited and can be adjusted according to practical application. The plurality of metallic carbon nanotubes can be oriented along one direction or multiple directions, as long as that the plurality of metallic carbon nanotubes are not contacted with each other on the first surface of the semiconductor layer. In one embodiment, the plurality of metallic carbon nanotubes are oriented along one direction, that is the plurality of metallic carbon nanotubes are parallel with each other.

The graphene layer is a continuous layered structure. A layer number of the graphene layer is not limited, and can be one layer, or multiple layers. A thickness of the graphene layer is not limited. However, the thicker the graphene layer, the lower a conductivity and light transmittance of the graphene layer. In one embodiment, the thickness of the graphene layer ranges from approximately 1 nanometer to 100 nanometers. A shape of the graphene layer is not limited, and can be a bar, a square, or the like. In one embodiment, the at least one graphene layer is a single graphene layer. In another embodiment, the at least one graphene layer comprises a plurality of graphene layers. The plurality of graphene layers are coplanar on the second surface of the semiconductor layer. The plurality of graphene layers are spaced apart from each other on the second surface of the semiconductor layer. A distance between the plurality of graphene layers is not limited and can be adjusted according to practical application.

The at least one metallic carbon nanotube and the at least one graphene layer are crossed with each other and separated from each other by the semiconductor layer. A three-layered stereoscopic structure can be formed by stacking the at least one metallic carbon nanotube, the semiconductor layer and the at least one graphene layer. A mixed-dimension Van der Waals heterostructure is formed in the three-layered stereoscopic structure. The at least one metallic carbon nanotube is in contact with the first surface of the semiconductor layer. The at least one graphene layer is in contact with the second surface of the semiconductor layer. The semiconductor layer is asymmetrically sandwiched between the carbon nanotubes and the conductive film. The asymmetric contact of the metallic carbon nanotube and the graphene layer with respect to the 2D semiconductor layer endows the Van der Waals heterostructure more excellent transport performance. When the semiconductor structure is used for a transistor, the Van der Waals heterostructure exhibits asymmetric output characteristics at opposite source-drain biases. A diversity of transport performance mainly result from that a fermi level of carbon nanotube is easily modulated and the semiconductor layer is asymmetrically contacted. While the carbon nanotube electrode is suitable for both electron-type and hole-type conductivity. The semiconducting structure based on asymmetric Van der Waals heterostructure exhibits unique performance and great potential in future nanoelectronics and nanoelectronics.

In the semiconductor structure, when the at least one metallic carbon nanotube comprises a plurality of metallic carbon nanotubes, or the at least one graphene layer comprises a plurality of graphene layers, the at least one metallic carbon nanotube and the at least one graphene layer are crossed with each other to form a plurality of three-layered stereoscopic structures. Each three-layered stereoscopic structure comprises a mixed-dimension Van der Waals heterostructure. Thereby, a Van der Waals heterostructure array comprising a plurality of Van der Waals heterostructure can be obtained. The heterostructure array can be used to prepare a nano-transistor array, a photodetector array, etc.

A semiconductor device using the semiconductor structure, a photodetector and a spectrometer are also provided in the present disclosure.

The semiconductor device comprises the semiconductor structure, a gate electrode, at least one first electrode, and at least one second electrode. The gate electrode is insulated from the semiconductor structure, the at least one first electrode and the at least one second electrode through an insulating layer. The semiconductor structure is electrically connected to the at least one first electrode and the at least one second electrode, respectively.

In the semiconductor device, the gate electrode is stacked with the insulating layer. The semiconductor structure is located on a surface of the insulating layer, and the insulating layer is located between the gate electrode and the semiconductor structure. In the semiconductor structure, the first surface of the semiconductor layer is close to the insulating layer and the second surface of the semiconductor layer is away from the insulating layer. The at least one metallic carbon nanotube is located between the semiconductor layer and the insulating layer. The number of the first electrode is the same as the number of the metallic carbon nanotube. The at least one first electrode is electrically connected to the at least one metallic carbon nanotube, respectively. The number of the second electrode is the same as the number of the graphene layer. The at least one second electrode is electrically connected to the at least one graphene layer, respectively.

Wherein, the gate electrode can be a layered structure. The gate electrode is made from a conductive material. The conductive material can be selected from the group consisting of metal, ITO, ATO, conductive silver paste, conductive polymer, conductive carbon nanotube, and semiconductor material. The metallic material can be aluminum, copper, tungsten, molybdenum, gold, titanium, palladium or any combination of alloys. The semiconductor material can be inorganic compound semiconductors, elemental semiconductors or organic semiconductors, such as gallium arsenide, silicon carbide, polysilicon, monocrystalline silicon, or naphthalene.

The insulating layer is made of insulating material. A thickness of the insulating layer ranges from approximately 1 nanometer to approximately 100 micrometers.

Both the first electrode and the second electrode are made from a conductive material. The conductive material can be selected from the group consisting of metal, ITO, ATO, conductive silver paste, conductive polymer, and conductive carbon nanotube. The metallic material can be aluminum, copper, tungsten, molybdenum, gold, titanium, palladium or any combination of alloys. The first electrode and the second electrode can be a conductive film. A thickness of the conductive film ranges from approximately 2 micrometers to approximately 100 micrometers.

The at least one metallic carbon nanotube is adjacent to the gate electrode, and the at least one graphene layer is away from the gate electrode. The at least one graphene layer does not cause a shielding effect between the semiconductor layer and the gate electrode. Therefore, the gate electrode can control the semiconductor structure in practical application.

In the semiconductor device, each Van der Waals heterostructure, the gate electrode, and the first electrode and second electrode corresponding to the Van der Waals heterostructure constitute a sub-semiconductor device. A plurality of sub-semiconductor devices can compose a semiconductor device array.

The photodetector comprises the semiconductor device mentioned above, at least one current detecting element, and at least one power source. The number of current detecting elements is the same as that of the Van der Waals heterostructures of the semiconductor device, and the number of power sources is also the same as that of the Van der Waals heterostructures. The first electrode and the second electrode corresponding to the same Van der Waals heterostructure are electronically connected to the same current detecting element and the same power source, and the current detecting element and the power source connecting with the same first electrode and second electrode are in the same circuit.

The current detecting element is used to detect a current in the circuit. The current detecting element can be an ammeter. The power source is used to supply a voltage for the first electrode and the second electrode, that is, to form a bias voltage between the first electrode and the second electrode.

The photodetector can qualitatively and quantitatively detect light. When the photodetector is used to qualitatively detect light, a working principle of the detector is discussed below. There is no current flowing through the metallic carbon nanotube, the semiconductor layer and the graphene layer when no light emitted on the photodetector, and no current can be detected by the current detecting element in the circuit. When a light is emitted on the photodetector, photo-generated carriers are generated in the semiconductor layer. The photo-generated carriers includes electrons and holes. The electrons and the holes can be separated by a built-in electric field formed between the metallic carbon nanotube and the graphene layer. Thus a photo-generated current is formed. That is, a current is generated in the circuit and is detected by the current detecting element.

When the photodetector is used to quantitatively detect light, a working principle of the photodetector is discussed below. The photodetector is irradiated with light of known intensity, and the current value detected by the current detecting element is read out. The light intensity is corresponding to the current value, and light with different intensity is corresponding to current with different intensity. As such, a graph of current value and light intensity can be obtained. When the photodetector is irradiated with light of unknown intensity, the intensity value of the light can be read out from the graph based on the current value detected by the current detecting element.

The spectrometer comprises an entrance slit, a collimating element, a dispersing element, a focusing element, and at least one photodetector mentioned above.

Figure 2:
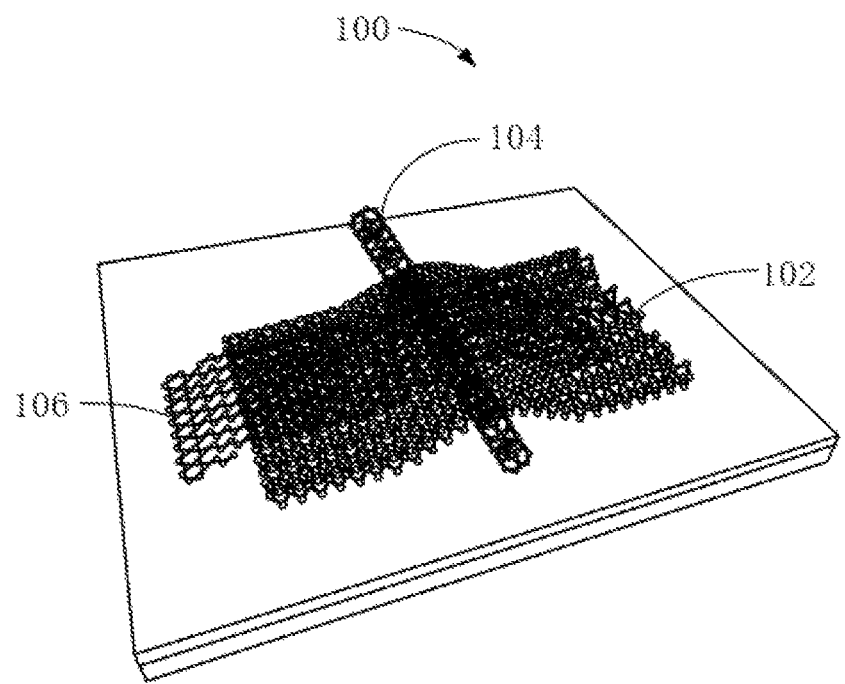
FIG. 2 shows a schematic view of stereoscopic structure of the semiconductor structure in FIG. 1.

Referring to FIG. 1 and FIG. 2, a semiconductor structure 100 is provided according to one embodiment. The semiconductor structure 100 comprises a semiconductor layer 102, one metallic carbon nanotube 104, and one graphene layer 106. Wherein, the semiconductor layer 102 is located between the metallic carbon nanotube 104 and the graphene layer 106. The semiconductor layer 102 defines a first surface and a second surface opposite to the first surface. The metallic carbon nanotube 104 is located on the first surface of the semiconductor layer 102. The graphene layer 106 is located on the second surface of the semiconductor layer 102.

The material of the semiconductor layer 102 is tungsten selenide ($WSe_2$), and the thickness of the semiconductor layer 102 is approximately 5.21 nanometers. The metallic carbon nanotubes 104 is prepared by removing an outer wall of a multi-walled metallic carbon nanotube. In this way, an outer surface of the metallic carbon nanotube 104 is super clean. Therefore, it is easy for the metallic carbon nanotube 104 to form a Van der Waals stacking with the semiconductor layer 102. A specific method of preparing the metallic carbon nanotube 104 will be described with detail in the subsequent content. A diameter of the metallic carbon nanotube 106 is approximately 1.19 nanometers. The thickness of graphene layer 106 is approximately 3.56 nanometers.

Figure 3:
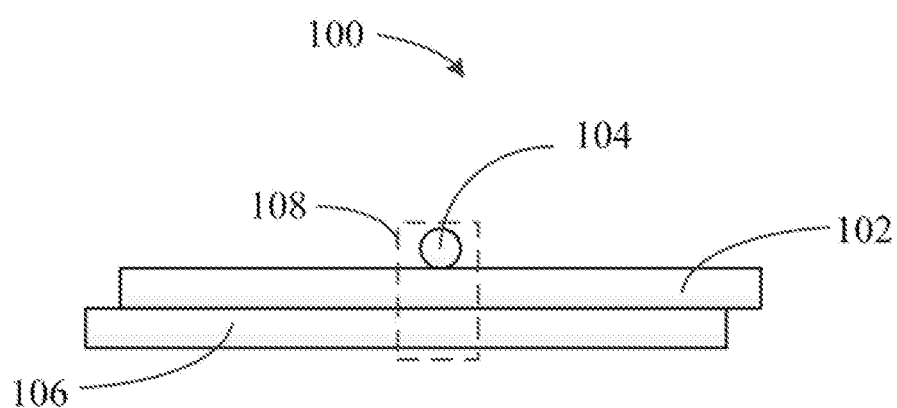
FIG. 3 shows a schematic view of side structure of the semiconductor structure in FIG. 1.

Referring to FIG. 3, a three-layered stereoscopic structure 108 is formed by stacking the metallic carbon nanotube 104, the semiconductor layer 105, and the graphene layer 106. A mixed-dimension Van der Waals heterostructure is formed in the three-layered stereoscopic structure 108 between the metallic carbon nanotube 104, the semiconductor layer 102 and the graphene layer 106.

A method for preparing the semiconductor structure 100 comprises the following steps:

step 11, placing a metallic carbon nanotube on a surface of a first substrate;

step 12, placing a semiconductor layer on a surface of a second substrate;

step 13, covering the semiconductor layer with a graphene layer;

step 14, transferring the graphene layer and the semiconductor layer from the second substrate to the first substrate, with the semiconductor layer being in contact with the surface of the first substrate and covering the metallic carbon nanotube.

The step 11~step 14 are described in detail as follows.

In the step 11, a metallic carbon nanotube is placed on a surface of a first substrate.

The metallic carbon nanotube can be directly prepared via a chemical vapor deposition method. Alternatively, the metallic carbon nanotube is prepared by removing an outer wall of a multi-walled metallic carbon nanotube. A method for removing the outer wall of the multi-walled metallic carbon nanotube comprises the following steps.

Step 111, providing a multi-walled metallic carbon nanotube.

The multi-walled metallic carbon nanotube is prepared via a chemical vapor deposition method.

Step 112, dividing the outer wall of the multi-walled metallic carbon nanotube into two parts.

The step 112 is carried out under an optical microscope. A method for dividing the outer wall of the multi-walled metallic carbon nanotube is not limited. For example, a laser beam can be used to cut the outer wall. In one embodiment, the multi-walled metallic carbon nanotube is gently shaken, and the outer wall of the multi-walled metallic carbon nanotube is divided into two parts. Further, before the outer wall of the multi-walled metallic carbon nanotube is divided, some nanoparticles can be deposited on an outer surface of the outer wall. The nanoparticles facilitate an observation of the outer wall under the optical microscope. A material of the nanoparticles is not limited, and can be titanium dioxide (TiO2), sulfur (S).

Step 113, providing two tips, the two tips respectively taking two ends of the outer wall of the multi-walled metallic carbon nanotube and moving towards two opposite directions to take off the outer wall of the multi-walled metallic carbon nanotube.

The step 113 is carried out under the optical microscope. A material of the tips is not limited. In one embodiment, the material of the tips is tungsten. After the outer wall of the multi-walled metallic carbon nanotube is removed through tungsten tips, the metallic carbon nanotubes used in one embodiment is obtained. The outer surface of the metallic carbon nanotube is ultra clean. Therefore, it is easy for the metallic carbon nanotube to stack with the semiconductor layer.

Then the metallic carbon nanotube is transferred onto the surface of the first substrate. In one embodiment, under the optical microscope, two ends of the metallic carbon nanotubes are taken by two tungsten tips, respectively. Then, the metallic carbon nanotube is gently lifted, and placed on the surface of the first substrate. A material and thickness of the first substrate are not limited and can be adjusted according to practical applications.

In the step 12, a semiconductor layer is placed on a surface of a second substrate.

In one embodiment, the material of the semiconductor layer is $WSe_2$. The $WSe_2$ layer is prepared via a method of mechanical exfoliation. The method for preparing the $WSe_2$ layer comprises: a $WSe_2$ single crystal is repeatedly peeled off with a tape, so that a thickness of the sheet-like $WSe_2$ becomes thinner and thinner until a $WSe_2$ layer with nano-thickness is obtained. Then, the surface of the second substrate is covered with the $WSe_2$ layer and the tape. The $WSe_2$ layer is in contact with the surface of the second substrate. Final, the tape is removed to leave the $WSe_2$ layer on the surface of the second substrate.

The second substrate serves to support and protect the semiconductor layer. A material and thickness of the second substrate is not limited and can be adjusted according to practical applications.

In the step 13, a graphene layer is placed on the semiconductor layer, and the semiconductor layer is disposed between the second substrate and the graphene layer.

The graphene layer can be prepared via different methods such as a method of mechanical exfoliation, or a chemical vapor deposition method. A method for placing the graphene layer on the semiconductor layer is not limited.

In one embodiment, the graphene layer is prepared via the method of mechanical exfoliation. The method for placing the graphene layer on the semiconductor layer comprises the following steps.

Step 131, providing a third substrate with a graphene layer on a surface of the third substrate.

The third substrate serves to support and protect the graphene layer. A material and thickness of the third substrate is not limited and can be adjusted according to practical applications.

Step 132, placing an adhesive film on a surface of the graphene layer away from the third substrate, and transferring the graphene layer onto a surface of the adhesive film.

A viscosity of the adhesive film increases under one condition (such as lighting, heating, etc.), and the viscosity of the adhesive film decreases under another condition (such as de-lighting, cooling, etc.). Therefore, the viscosity of the adhesive film can be increased first so that the bonding force between the graphene layer and the adhesive film is greater than that between the graphene layer and the substrate, and then the adhesive film is peeled off from the third substrate with the graphene layer adhered to the surface of the adhesive film.

A material of the adhesive film is not limited as long as it possesses characteristics mentioned above. In one embodiment, the adhesive film is made of polyvinyl alcohol (PVA), the viscosity of the PVA increases under heating, and the viscosity of the PVA decreases under cooling. In addition, the PVA is easily soluble in water, thus the PVA can be removed by water.

Step 133, transferring the adhesive film adhered with a graphene layer to a surface of the semiconductor layer on the second substrate, the graphene layer being located between the adhesive film and the semiconductor layer, and removing the adhesive film with the graphene layer left on the surface of the semiconductor layer.

The adhesive film adhered with the graphene layer is transferred onto the surface of the semiconductor layer on the second substrate. Then, the viscosity of the adhesive film is lowered so that the bonding force between the graphene layer and the adhesive film is smaller than that between the graphene layer and the semiconductor layer. And then, the adhesive film is peeled off from the graphene layer. In this way, the graphene layer is transferred onto the surface of the semiconductor layer.

In one embodiment, after the PVA film adhered with the graphene layer is transferred onto the surface of the semiconductor layer, a four-layer structure formed by the PVA film, the graphene layer, the semiconductor layer, and the second substrate is immersed in water. The PVA is dissolved in water and removed.

In the strep 14, the graphene layer and the semiconductor layer are transferred onto the surface of the first substrate from the second substrate. The semiconductor layer is in contact the surface of the first substrate and covers the metallic carbon nanotube. The semiconductor layer is located between the graphene layer and the metallic carbon nanotube. The metallic carbon nanotube, the semiconductor layer, and the graphene layer are overlapped with each other to form a three-layered stereoscopic structure.

The method of transferring the graphene layer and the semiconductor layer onto the surface of the first substrate is the same as the method of placing the graphene layer onto the surface of the semiconductor layer in the step 13, and will not be described in detail herein.

After prepared, the semiconductor structure 100 is further annealed. The annealing is carried out in a vacuum environment. An annealing temperature ranges from approximately 300 to approximately 400° C. The process of annealing can remove impurities on the surface of the semiconductor structure 100, and further enhance the bonding force between the graphene layer, the semiconductor layer, and the metallic carbon nanotubes.

Figure 4:
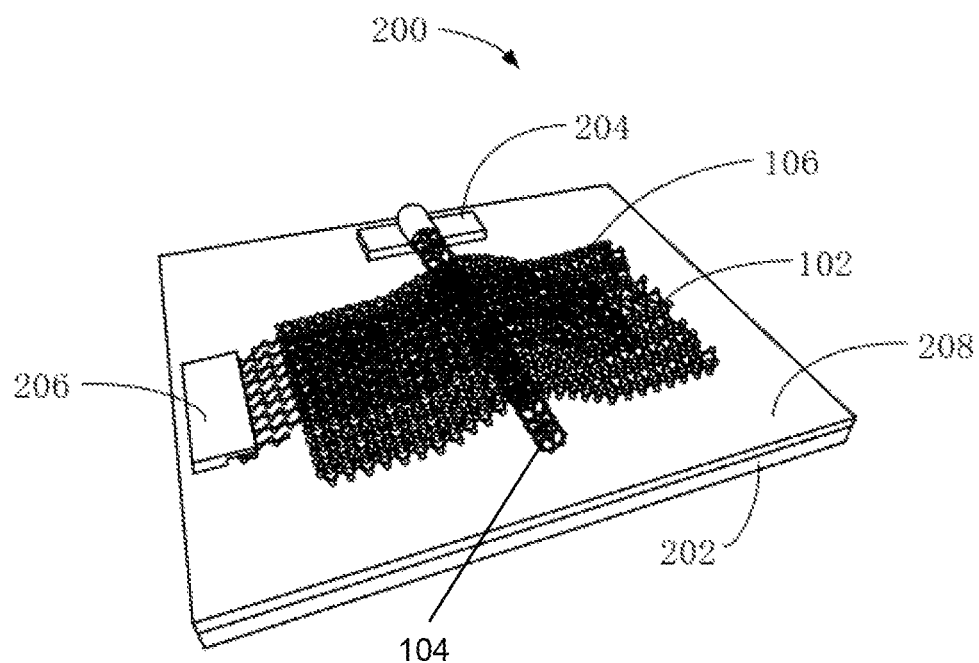
FIG. 4 shows a schematic view of stereoscopic structure of a semiconductor device according to one embodiment.

Referring to FIG. 4, a semiconductor device 200 using the semiconductor structure 100 is provided according to one embodiment. The semiconductor device 200 comprises the semiconductor structure 100, a gate electrode 202, an insulating layer 208, a first electrode 204, and a second electrode 206. Wherein, the gate electrode is insulated from the semiconductor structure 100, the first electrode 204, and the second electrode 206 through the insulating layer 208. The semiconductor structure 100 is electrically connected to the first electrode 204 and the second electrode 206.

In the semiconductor device 200, the gate electrode 202 is a layered structure. The insulating layer 208 is located on a surface of the gate electrode 202. The semiconductor structure 100 is placed on a surface of the insulating layer 208 so that the insulating layer 208 is located between the gate electrode 202 and the semiconductor structure 100. In the semiconductor structure 100, the metallic carbon nanotube 104 is directly disposed on the surface of the insulating layer 208. The semiconductor layer 102 is disposed on the surface of the insulating layer 208 and covers the metallic carbon nanotubes 104. The metallic carbon nanotube 104 is located between the semiconductor layer 102 and the insulating layer 208. The graphene layer 106 is disposed on a surface of the semiconductor layer 102 away from the insulating layer 208.

In one embodiment, the gate electrode 202 is a silicon wafer. The insulating layer 208 is silicon oxide formed on the surface of the silicon wafer, and the thickness of the silicon oxide is approximately 300 nanometers. The first electrode 204 and the second electrode 206 are metal composite structure of Au and Ti. Specifically, the metal composite structure comprises an Au layer and a Ti layer stacked with each other. A thickness of the Ti layer is approximately 10 nanometers, and a thickness of the Au layer is approximately 50 nanometers. The first electrode 204 is located at one end of the metallic carbon nanotube 104 and adhered on a surface of the metallic carbon nanotube 104, wherein the Ti layer is located on the surface of the metallic carbon nanotube 104, and the Au layer is located on a surface of the Ti layer. The second electrode is located at one end of the graphene layer 106 and adhered on a surface of the graphene layer 106, wherein the Ti layer is located on the surface of the graphene layer 106, and the Au layer is disposed on a surface of the Ti layer.

Figure 5:
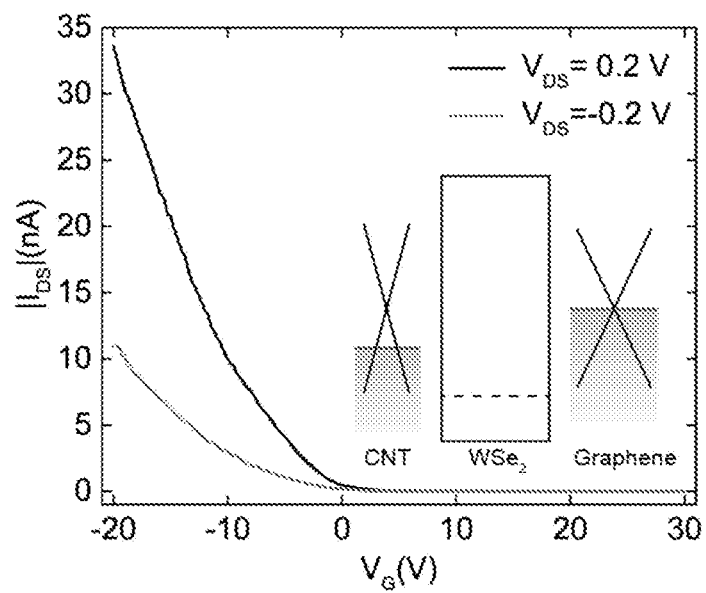
FIG. 5 shows an output characteristic curve of a transistor using the semiconductor device in FIG. 4.

In the semiconductor device 200, a heterojunction is formed between the metallic carbon nanotube 104 and the semiconductor layer 102 and the graphene layer 106, that is, the heterojunction is formed inside the three-layered stereoscopic structure 108. The semiconductor device 200 can be used as a transistor. The first electrode 204 can be a drain electrode, and the second electrode 206 can be a source electrode. By applying different voltages on the gate electrode 202, a height of the heterojunction barrier can be changed to control the current between the first electrode 204 and the second electrode 206. In one embodiment, the material of the semiconductor layer 104 is $WSe_2$, a p-type semiconductor. The bias voltage between the first electrode 204 and the second electrode 206 is kept unchanged, when the voltage of the gate electrode 208 is positive, the heterojunction barrier in the three-layered stereoscopic structure 108 would be increased, almost no current flows between the first electrode 202 and the second electrode 204, and the transistor is in off state. The bias voltage between the first electrode 204 and the second electrode 206 is kept unchanged, when the voltage of the gate electrode 208 is negative, the heterojunction barrier in the three-layered stereoscopic structure 108 would be decreased, the current flows between the first electrode 204 and the second electrode 206, and the transistor is in on state. Referring to FIG. 5, an on/off ratio of the transistor is as high as $10^4$. Moreover, it can be seen from the FIG. 5 that the on current at positive drain-source bias (VDS) is much larger than that at negative bias, which can be ascribed to the asymmetrical contacts on WSe2 induced by the 2D graphene layer and 1D metallic carbon nanotube. This asymmetric transport property indicates that a fermi level of the graphene is higher than that of the metallic carbon nanotube.

Figure 6:
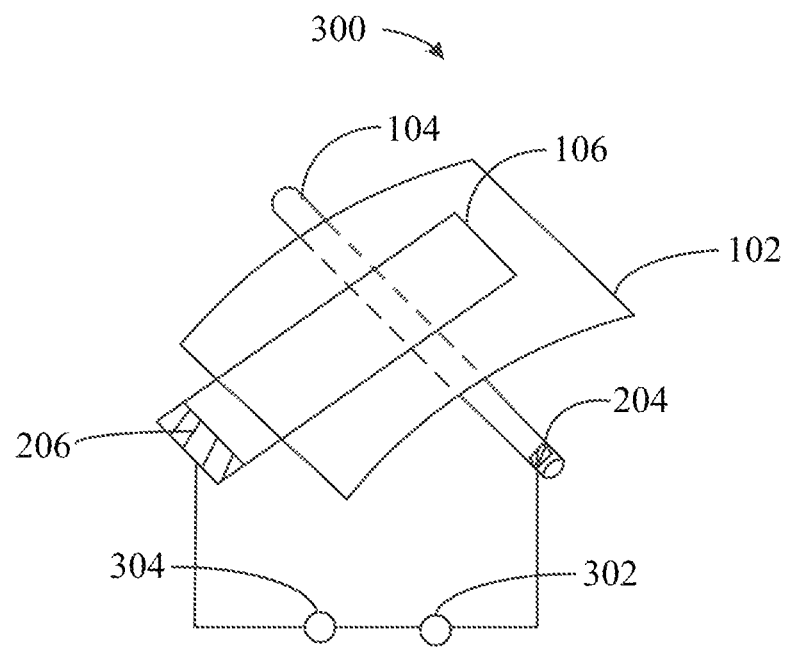
FIG. 6 shows a schematic view of overall structure of a photodetector according to one embodiment.

Referring to FIG. 6, a photodetector 300 is also provided according to one embodiment. The photodetector 300 comprises the semiconductor device 200, a current detecting element 302, and a power source 304. Wherein, the gate electrode 202 and the insulating layer 208 of the semiconductor device 200 are not shown in FIG. 6.

In the photodetector 300, the first electrode 204, the current detecting element 302, the power source 304, and the second electrode 206 are electrically connected with each other to form a circuit.

Figure 7:
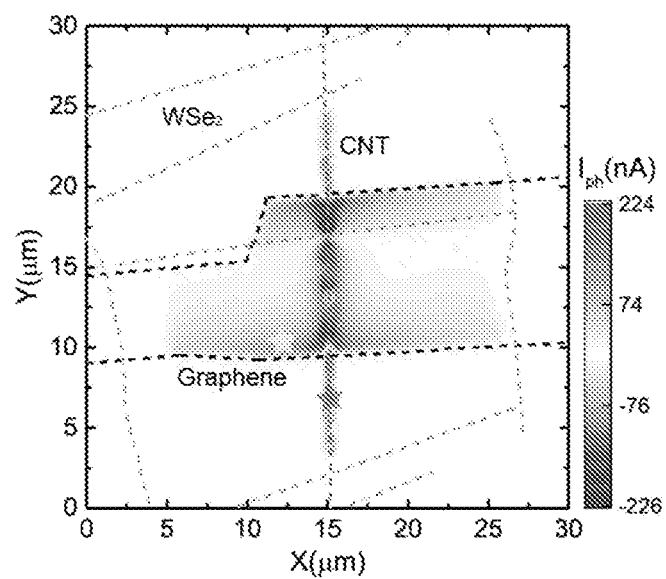
FIG. 7 shows a Scanning Photocurrent Microscopy image (SPCM) of the photodetector in FIG. 6.

The photoelectric property of the photodetector 300 is further investigated by a scanning photocurrent microscopy. As is shown in FIG. 7, under a scanning photocurrent microscopy, both the gate voltage ($V_G$) and the bias ($V_{DS}$) are set to zero, and the photodetector 300 is irradiated by a 520 nm laser. Referring to FIG. 7, photocurrents are generated in three different areas, that is an overlapped area of the metallic carbon nanotube, the $WSe_2$ layer and the graphene layer, an overlapped area of the metallic carbon nanotube and the $WSe_2$ layer, and an overlapped area of the $WSe_2$ layer and the graphene layer, denoted as CNT-$WSe_2$-graphene, CNT-$WSe_2$ and $WSe_2$-graphene, respectively. The fermi level of the metallic carbon nanotube and the graphene layer is higher than that of the $WSe_2$ layer, and the fermi level of the graphene layer is higher than that of the metallic carbon nanotube. The CNT-$WSe_2$-graphene area is the three-layered stereoscopic structure 108, and the photocurrent generated at the area flows from the graphene layer to the metallic carbon nanotube and is negative. At CNT-$WSe_2$ area, a direction of the built-in electric field is from the metallic carbon nanotube to the $WSe_2$ layer, thus the photocurrent flows from the metallic carbon nanotube to the $WSe_2$ layer. At the $WSe_2$-graphene area, the direction of the build-in electric field is from the graphene layer to the $WSe_2$ layer, thus the photocurrent flows from the graphene layer to the $WSe_2$ layer.

Figure 8:
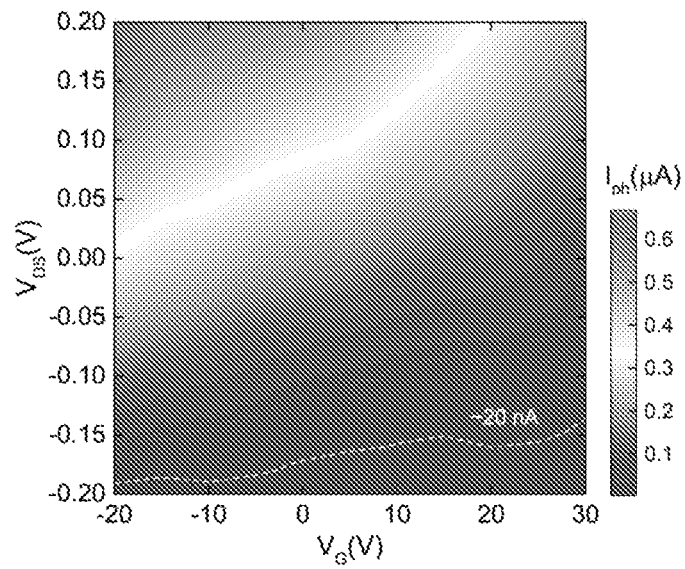
FIG. 8 shows a graph of photocurrent mapping of an overlapped area of a metallic carbon nanotube and a $WSe_2$ layer.
Figure 9:
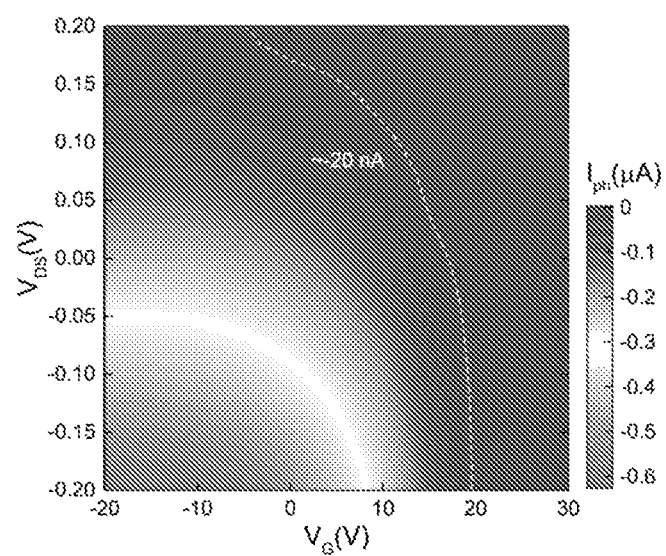
FIG. 9 shows a graph of photocurrent mapping of an overlapped area of the $WSe_2$ layer and a graphene layer.

Two points are selected at the CNT-$WSe_2$ area and the $WSe_2$-graphene area respectively, that is, positions indicated by asterisks in FIG. 7. The two points are irradiated by a same laser under different gate voltages and biases, respectively. In this way, graphs of photocurrent mapping of the CNT-WSe$_2$ area and the WSe$_2$-graphene area can be obtained, as is shown in FIG. 8 and FIG. 9, respectively. Referring to FIG. 8 and FIG. 9, when the gate voltage is negative and the bias is positive, the CNT-WSe$_2$ area is more sensitive to light irradiation, and can generate a larger photocurrent than the WSe$_2$-graphene area. While, when the gate voltage and the bias are negative simultaneously, the WSe$_2$-graphene area is more sensitive to light irradiation, and can generate a larger photocurrent than the CNT-WSe$_2$ area. The photoelectric properties of the CNT-WSe$_2$ area and the WSe$_2$-graphene area can be controlled by adjusting the gate voltage and the bias. Thereby, the photosensitive area of photodetector 300 is tunable by simply adjusting the bias or gate voltages.

Figure 10:
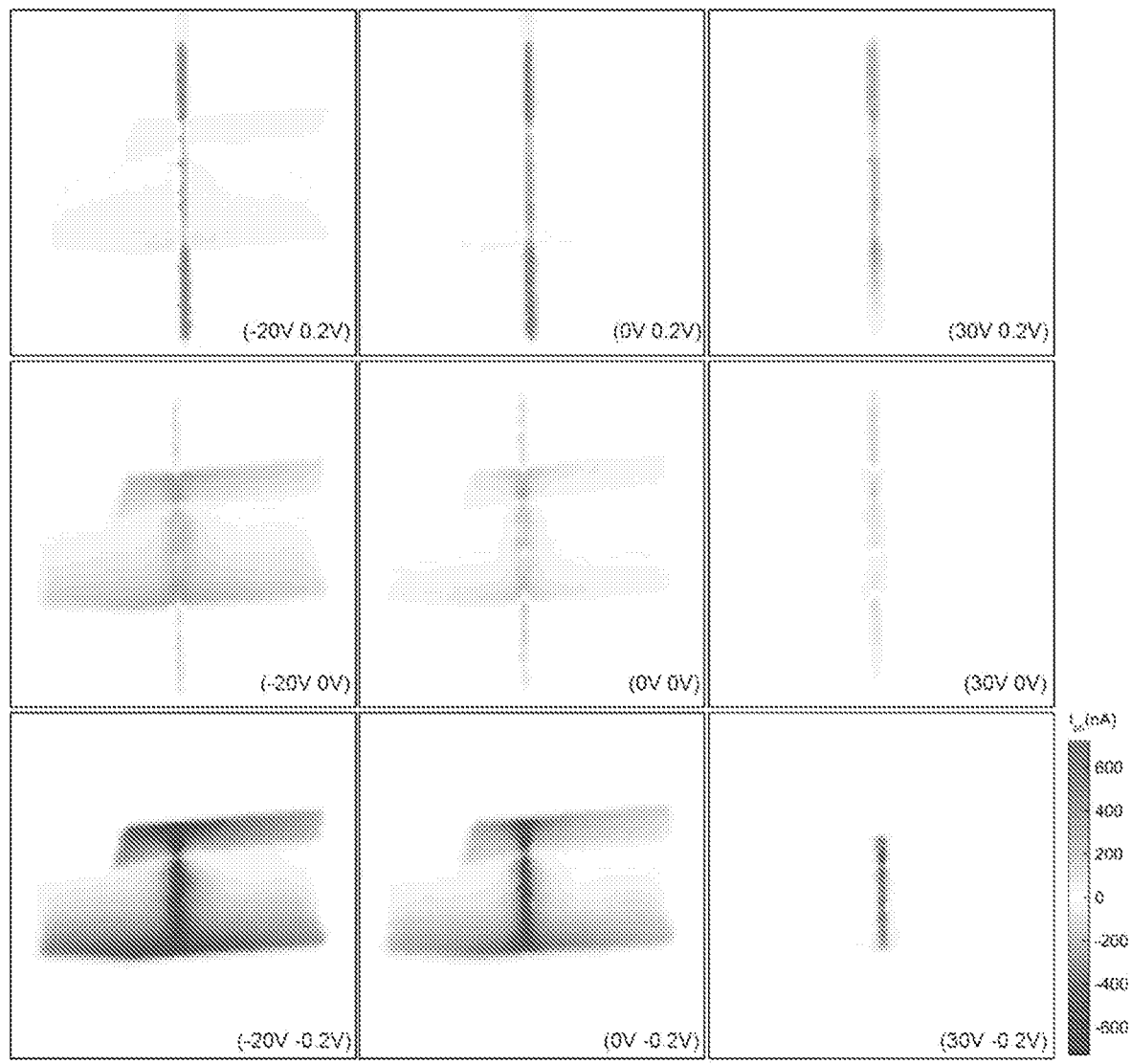
FIG. 10 shows SPCM images of the photodetector in FIG. 6 with a gate voltage varying from −20 V to 30 V and a bias changing from −0.2 V to 0.2 V, simultaneously.

A resolution and responsivity of the photodetector are related to the photosensitive area of the photodetector. When the photosensitive area is large, the photocurrent is large, the responsivity is large, and the resolution of the photodetector is low. When the photosensitive area is small, the photocurrent is small, the responsivity is small, and the resolution of the photodetector is high. Referring to FIG. 10, as the gate voltage and the bias change, the SPCM image of the photodetector 300 changes, that is, the photosensitive area of the photodetector 300 changes. These SPCM images indicate that there are two working modes of the photodetector 300. The first one is Low Resolution Mode, when the gate voltage is −20V and the bias voltage is −0.2V. As the whole overlapping region of WSe$_2$ and graphene has prominent response to illumination, the photosensitive area and the responsivity are large, and the resolution is low. The second one is High Resolution Mode, when the gate voltage is 30V and the bias voltage is −0.2V. As only three principle materials overlapping region responds, the photosensitive area and the responsivity are small, and the resolution is high. The photosensitive area of the photodetector 300 can be controlled by adjusting the gate voltage and the bias, thus the resolution and the responsivity of the photodetector can be further adjusted. In one embodiment, the material of the semiconductor layer is WSe$_2$, a P-type semiconductor, and when the gate voltage is positive and the bias is negative, high resolution can be obtained. Thereby, it can be understood that when the material of the semiconductor layer is an N-type semiconductor, high resolution can be achieved when the gate voltage is negative and the bias is positive.

Figure 11:
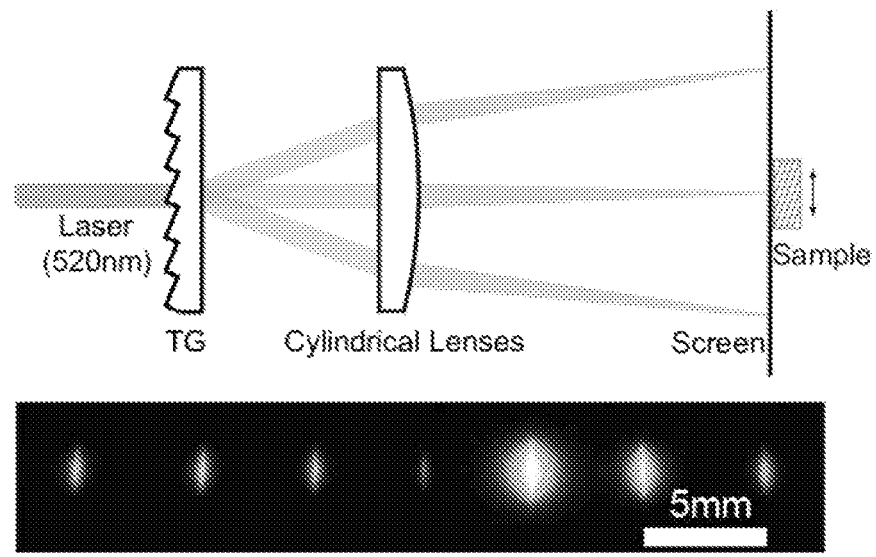
FIG. 11 shows a schematic view of a spectrum measuring system.
Figure 12:
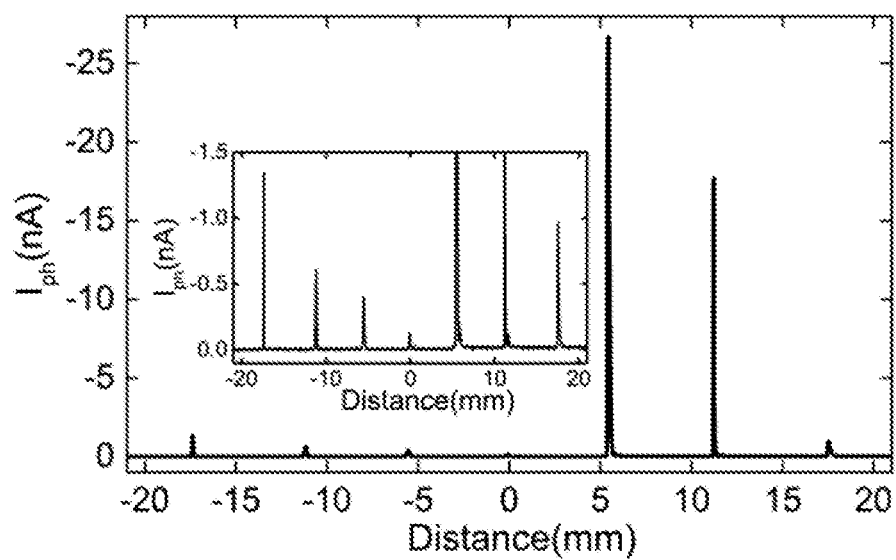
FIG. 12 shows a distribution curve of photocurrent intensity of the spectrum measuring system in FIG. 11.

The photodetector 300 can be used in a spectrometer for spectral measurement. Referring to FIG. 11, the laser beam is dispersed by a transmission grating and focused by a cylindrical lens, and finally bright fringes are imaged on a screen. The photodetector 300 working at High Resolution Mode (V$_G$=30 V, V$_{DS}$=−0.2 V) scans these bright fringes linearly on the screen. Thus, a distribution curve of photocurrent intensity can be obtained, as is shown in FIG. 12. Referring to FIG. 12, a signal-to-noise ratio of the photodetector 300 is more than 5000. The photodetector 300 has high sensitivity and resolution.

Figure 13:
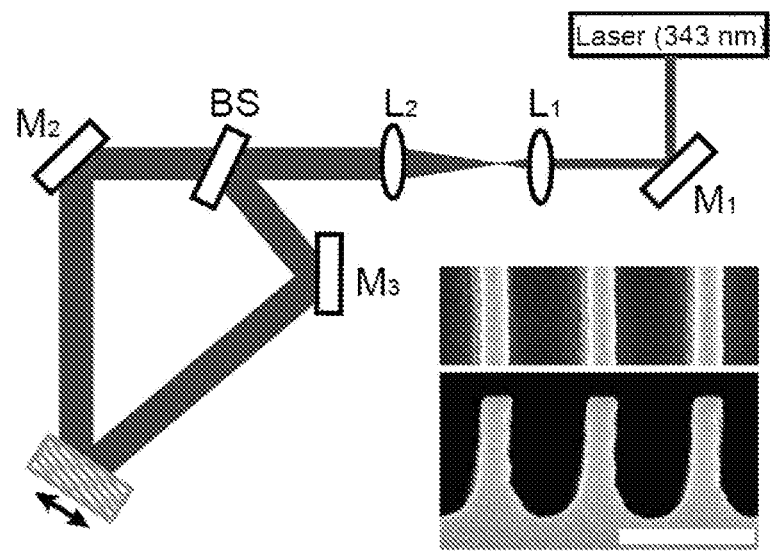
FIG. 13 shows a schematic view of a double-beam interference system.
Figure 14:
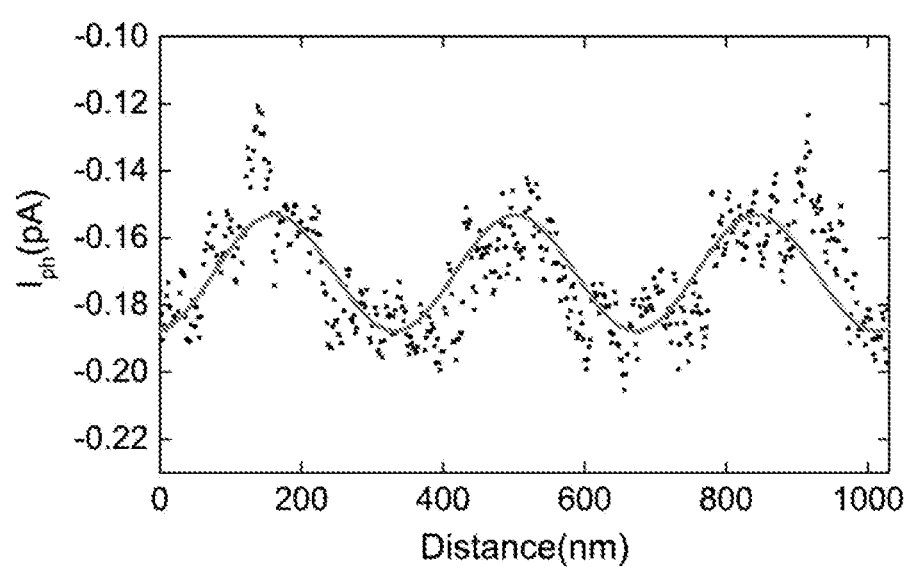
FIG. 14 shows a distribution curve of photocurrent intensity of the double-beam interference system in FIG. 13.

In addition, the photodetector 300 can achieve extremely high resolution by adjusting the gate voltage and bias, and can be used for a detection of a fine spectral structure. Referring to FIG. 13, a laser beam of 343 nm is reflected by a mirror 1 and then passes through a lens 1, a lens 2, and is split into two beams by a beam splitter. The two beams are respectively reflected by a mirror 2 and a mirror 3, and finally aggregate and interfere with each other to form bright and dark fringes. The double-beam interference system can be used to manufacturing a grating structure. The grating structure is shown as FIG. 13 inset, and a period of the grating structure is 334 nm. The photodetector 300 working at High Resolution Mode (V$_G$=30 V, V$_{DS}$=−0.2V) is used to linearly scan the bright and dark fringes, and the scanning result is shown in FIG. 14. Referring to FIG. 14, sine function fitting shows the period of bright and dark fringes is 340.5 nm. This result is admirably consistent with the period of interference fringes at no more than 1.95% error.

A spectrometer is also provided according to one embodiment. The spectrometer comprises an entrance slit, a collimating element, a dispersing element, a focusing element, and at least one of the photodetectors 300. The spectrometer can achieve high precision, high sensitivity and high resolution by adjusting the gate voltage and the bias.

Figure 15:
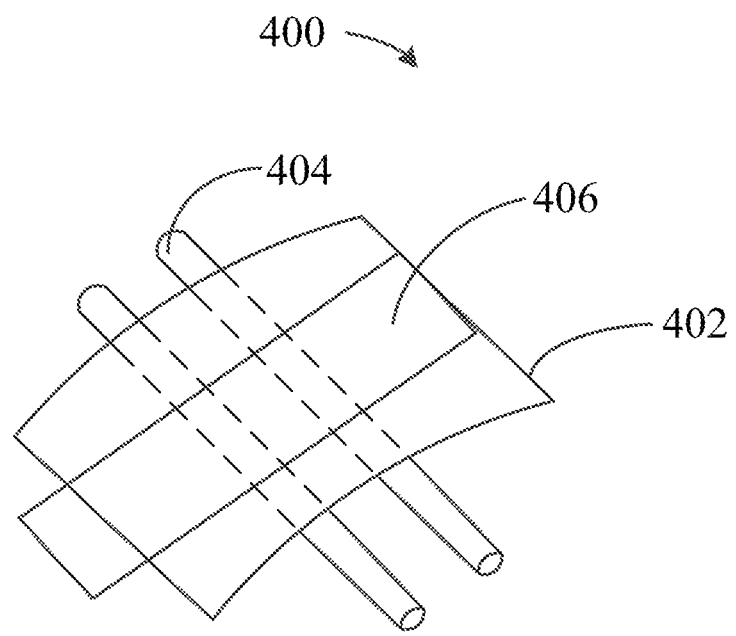
FIG. 15 shows a schematic view of overall structure of a semiconductor structure according to another embodiment.
Figure 16:
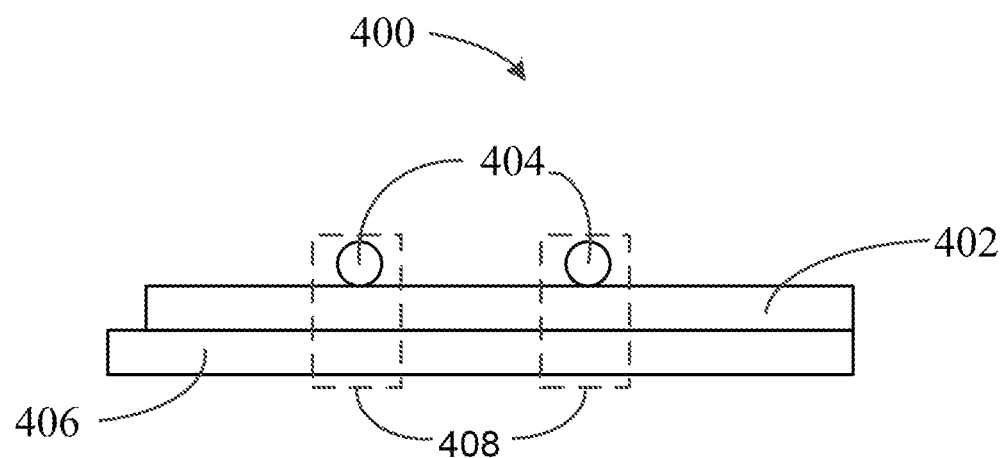
FIG. 16 shows a schematic view of side structure of the semiconductor structure in FIG. 15.

Referring to FIG. 15 and FIG. 16, a semiconductor structure 400 is provided according to another embodiment. The semiconductor structure 400 comprises a semiconductor layer 402, two metallic carbon nanotubes 404, and a graphene layer 406. Wherein, the semiconductor layer 402 is located between the two metallic carbon nanotubes 404 and the graphene layer 406. The semiconductor layer 402 defines a first surface and a second surface opposite to the first surface. The two metallic carbon nanotubes 404 are located on the first surface of the semiconductor layer 402. The graphene layer 406 is located on the second surface of the semiconductor layer 402.

The two metallic carbon nanotubes are parallel with each other and spaced apart from each other on the first surface of the semiconductor layer 402. The distance between the two metallic carbon nanotubes is approximately 3.3 micrometers. The two metallic carbon nanotubes 404, the semiconductor layer 402 and the graphene layer 406 are stacking with each other to form two three-layered stereoscopic structures 408. At each multi-layer stereoscopic structure 408, a Van der Waals heterostructure is formed by the metallic carbon nanotube 404, the graphene layer 406 and the semiconductor layer 402.

Figure 17:
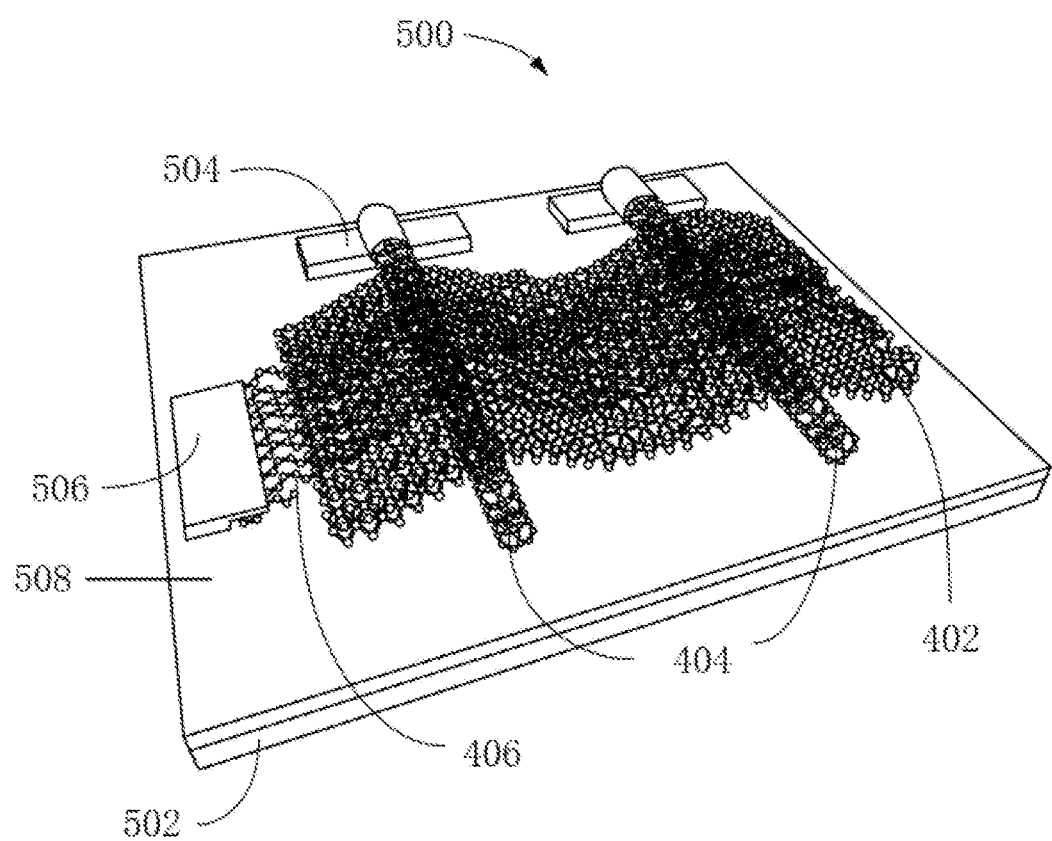
FIG. 17 shows a schematic view of stereoscopic structure of a semiconductor device according to another embodiment.

Referring to FIG. 17, a semiconductor device 500 using the semiconductor structure 400 is provided according to another embodiment. The semiconductor device 500 comprises the semiconductor structure 400, a gate electrode 502, two first electrodes 504, and a second electrode 506. The gate electrode 502 is insulating from the semiconductor structure 400, the first electrodes 504, and the second electrode 506 through an insulating layer 508. The semiconductor structure 400 is electronically connected with the first electrode 504 and the second electrodes 506.

In the semiconductor device 500, the gate electrode 502 and the insulating layer 508 are stacked with each other. The semiconductor structure 400 is placed on a surface of the insulating layer 508 so that the insulating layer 508 is located between the gate electrode 502 and the semiconductor structure 400. In the semiconductor structure 400, the two metallic carbon nanotubes 404 are directly disposed on the surface of the insulating layer 508. The semiconductor layer 402 is disposed on the surface of the insulating layer 508 and covers the two metallic carbon nanotubes 404. The two metallic carbon nanotubes 404 are located between the semiconductor layer 402 and the insulating layer 508. The graphene layer 406 is disposed on the surface of the semiconductor layer 402 away from the insulating layer 508. The two first electrodes 504 are electrically connected to the two metallic carbon nanotubes 404, respectively. The second electrode 506 is electrically connected to the graphene layer 406.

The gate 502, the insulating layer 508, the first electrodes 502, and the second electrode 506 are the same as the gate 202, the insulating layer 208, the first electrode 202, and the second electrode 206, respectively, and will not be described here.

Figure 18:
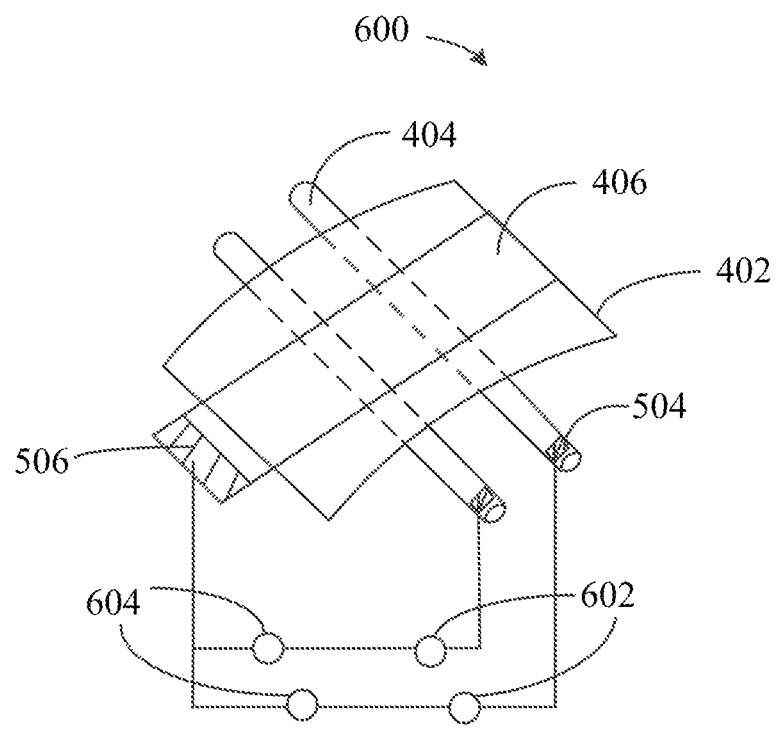
FIG. 18 shows a schematic view of overall structure of a photodetector according to another embodiment.

Referring to FIG. 18, a photodetector 600 is also provided according to another embodiment. The photodetector 600 comprises the semiconductor device 500, two current detecting elements 602, and two power sources 604. Wherein, the gate electrode 502 and the insulating layer 508 of the semiconductor device 500 are not shown in FIG. 18. The current detecting element 602 and the power source 604 are the same as the current detecting element 302 and the power source 304, and will not be described here.

Figure 19:
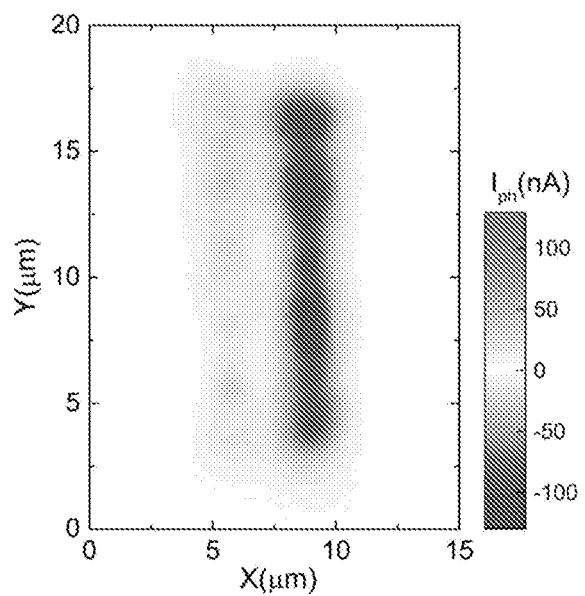
FIG. 19 shows a SPCM image of the photodetector in FIG. 18.

The photodetector 600 comprises two overlapping areas of the metallic carbon nanotube, the $WSe_2$ layer and the graphene layer, that is the CNT-$WSe_2$-graphene area. The photodetector 600 working at High Resolution Mode ($V_G$=30 V, $V_{DS}$=−0.2 V) is illuminated by the laser to obtain a SPCM image. The SPCM image is shown in FIG. 19. Referring to FIG. 19, under High Resolution Mode, the photosensitive areas are limited to the two CNT-$WSe_2$-graphene areas, and only these areas can generate photocurrent. The difference between photocurrent intensity of the two areas may result from the difference between chirality of the two metallic carbon nanotubes.

Moreover, a spectrometer using the photodetector 600 is also provided according to another embodiment.

In the present disclosure, the metallic carbon nanotube, the semiconductor layer, and the graphene layer are vertically stacked with each other. Thus, a mixed-dimensional Van der Waals heterostructure can be achieved. The asymmetric contact of the metallic carbon nanotube and the graphene layer with the semiconductor layer endows the Van der Waals heterostructure more excellent transport performance. The asymmetric contact also endows the photodetector with a distinctive electrical control property on spatial resolution. The overlapping areas of CNT-$WSe_2$-graphene, CNT-$WSe_2$, and $WSe_2$-graphene can serve as photosensitive areas by electrical control, respectively. The photosensitive areas are sensitive to both gate voltage and bias potentials. Two working modes-High Resolution Mode and Low Resolution Mode—can be achieved via appropriate gate voltage and bias. In addition, the photodetector can be used in a spectrometer for spectral measurement. The spectrometer working at High Resolution Mode can detect bright and dark interference fringes with a period of 334 nm. The spectrometer characters in high sensitivity, high resolution, and high precision.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor structure, comprising:
    a semiconductor layer defining a first surface and a second surface opposite to the first surface;
    a single metallic carbon nanotube located on the first surface of the semiconductor layer; and
    at least one graphene layer located on the second surface of the semiconductor layer,
    wherein the single metallic carbon nanotube, the semiconductor layer and the at least one graphene layer are stacked with each other to form at least one three-layered stereoscopic structure, the semiconductor layer is asymmetrically sandwiched between the single metallic carbon nanotube and the at least one graphene layer.

2. The semiconductor structure of claim 1, wherein a thickness of the semiconductor layer ranges from approximately 1 nanometer to 100 nanometers.

3. The semiconductor structure of claim 1, wherein a diameter of the single metallic carbon nanotube ranges from approximately 0.5 nanometers to 150 nanometers.

4. The semiconductor structure of claim 1, wherein a thickness of the graphene layer ranges from approximately 1 nanometer to 100 nanometers.

5. The semiconductor structure of claim 1, wherein the at least one graphene layer is a single graphene layer.

6. The semiconductor structure of claim 1, wherein the at least one graphene layer comprises a plurality of graphene layers.

7. The semiconductor structure of claim 6, wherein the plurality of graphene layers are coplanar on the second surface of the semiconductor layer.

8. The semiconductor structure of claim 6, wherein the plurality of graphene layers are spaced apart from each other on the second surface of the semiconductor layer.

9. The semiconductor structure of claim 1, wherein the single metallic carbon nanotube is prepared by removing an outer wall of a multi-walled metallic carbon nanotube.

10. A semiconductor device, comprising:
    a gate electrode with a layered structure;
    an insulating layer located on a surface of the gate electrode;
    at least one metallic carbon nanotube located on a surface of the insulating layer;
    a semiconductor layer located on the surface of the insulating layer and covering the at least one metallic carbon nanotube;
    at least one graphene layer located on a surface of the semiconductor layer, wherein the semiconductor layer is located between the at least one metallic carbon nanotube and the at least one graphene layer and the at least one metallic carbon nanotube, the semiconductor layer and the at least one graphene layer are stacked with each other to form at least one three-layered stereoscopic structure;
    at least one first electrode electrically connected to the at least one metallic carbon nanotube; and
    at least one second electrode electrically connected to the at least one graphene layer.

11. The semiconductor device of claim 10, wherein a number of the first electrode is the same as a number of the metallic carbon nanotube, and a number of the second electrode is the same as a number of the graphene layer.

12. The semiconductor device of claim 10, wherein the first electrode is located at one end of the metallic carbon nanotube and adhered on a surface of the metallic carbon nanotube.

13. The semiconductor device of claim 10, wherein the second electrode is located at one end of the graphene layer and adhered on a surface of the graphene layer.

14. A photodetector, comprising:
a gate electrode being a layered structure;
an insulating layer located on a surface of the gate electrode;
at least one metallic carbon nanotube located on a surface of the insulating layer;
a semiconductor layer located on the surface of the insulating layer and covering the at least one metallic carbon nanotube;
at least one graphene layer located on a surface of the semiconductor layer, wherein the semiconductor layer is located between the at least one metallic carbon nanotube and the at least one graphene layer and the at least one metallic carbon nanotube, the semiconductor layer and the at least one graphene layer are stacked with each other to form at least one three-layered stereoscopic structure;
at least one first electrode electrically connected to the at least one metallic carbon nanotube;
at least one second electrode electrically connected to the at least one graphene layer;
at least one current detecting element electrically connected with the at least first electrode and the at least second electrode; and
at least one power source electrically connected with the at least first electrode and the at least second electrode.

15. The photodetector of claim 14, wherein a number of the current detecting element is the same as a number of the three-layered stereoscopic structure.

16. The photodetector of claim 14, wherein a number of the power source is the same as a number of the three-layered stereoscopic structure.

\* \* \* \* \*